United States Patent

Ishida et al.

[11] Patent Number: 5,908,718
[45] Date of Patent: Jun. 1, 1999

[54] PHASE SHIFTING PHOTOMASK WITH TWO DIFFERENT TRANSPARENT REGIONS

[75] Inventors: Shinji Ishida; Tadao Yasuzato, both of Tokyo, Japan

[73] Assignee: NEC Corporation, Tokyo, Japan

[21] Appl. No.: 08/828,531

[22] Filed: Mar. 31, 1997

[51] Int. Cl.⁶ .................................................. G03F 9/00
[52] U.S. Cl. ............................................................ 430/5
[58] Field of Search ................................................ 430/5

[56] References Cited

U.S. PATENT DOCUMENTS

| | | | |
|---|---|---|---|
| 5,244,759 | 9/1993 | Pierrat | 430/5 |
| 5,275,896 | 1/1994 | Garofalo et al. | 430/5 |
| 5,300,378 | 4/1994 | Minami | 430/5 |
| 5,348,826 | 9/1994 | Dao et al. | 430/5 |
| 5,352,550 | 10/1994 | Okamoto | 430/5 |
| 5,354,632 | 10/1994 | Dao et al. | 430/5 |
| 5,358,808 | 10/1994 | Nitayama et al. | 430/5 |
| 5,405,721 | 4/1995 | Pierrat | 430/5 |
| 5,688,409 | 11/1997 | Dao et al. | 430/5 |

OTHER PUBLICATIONS

Pierrat et al., "Phase–Shifting Mask Topography Effects on Lithographic Image Quality", SPIE vol. 1927, Optical/Laser Microlithography VI pp. 28–41, 1993.

Primary Examiner—Bernard Codd
Attorney, Agent, or Firm—Foley & Lardner

[57] ABSTRACT

Disclosed is a photomask, which has: a transparent substrate; and masking film which is selectively formed on the transparent substrate to provide a predetermined pattern composed of a transparent region and a masking region; wherein the transparent region comprises a first transparent region which is formed adjacent to the masking region and extends like a belt along the masking region and a second transparent region which lies sandwiching the first transparent region with the masking region, whereby a phase of exposure light through the first transparent region is advanced prior to that through the second transparent region.

8 Claims, 8 Drawing Sheets

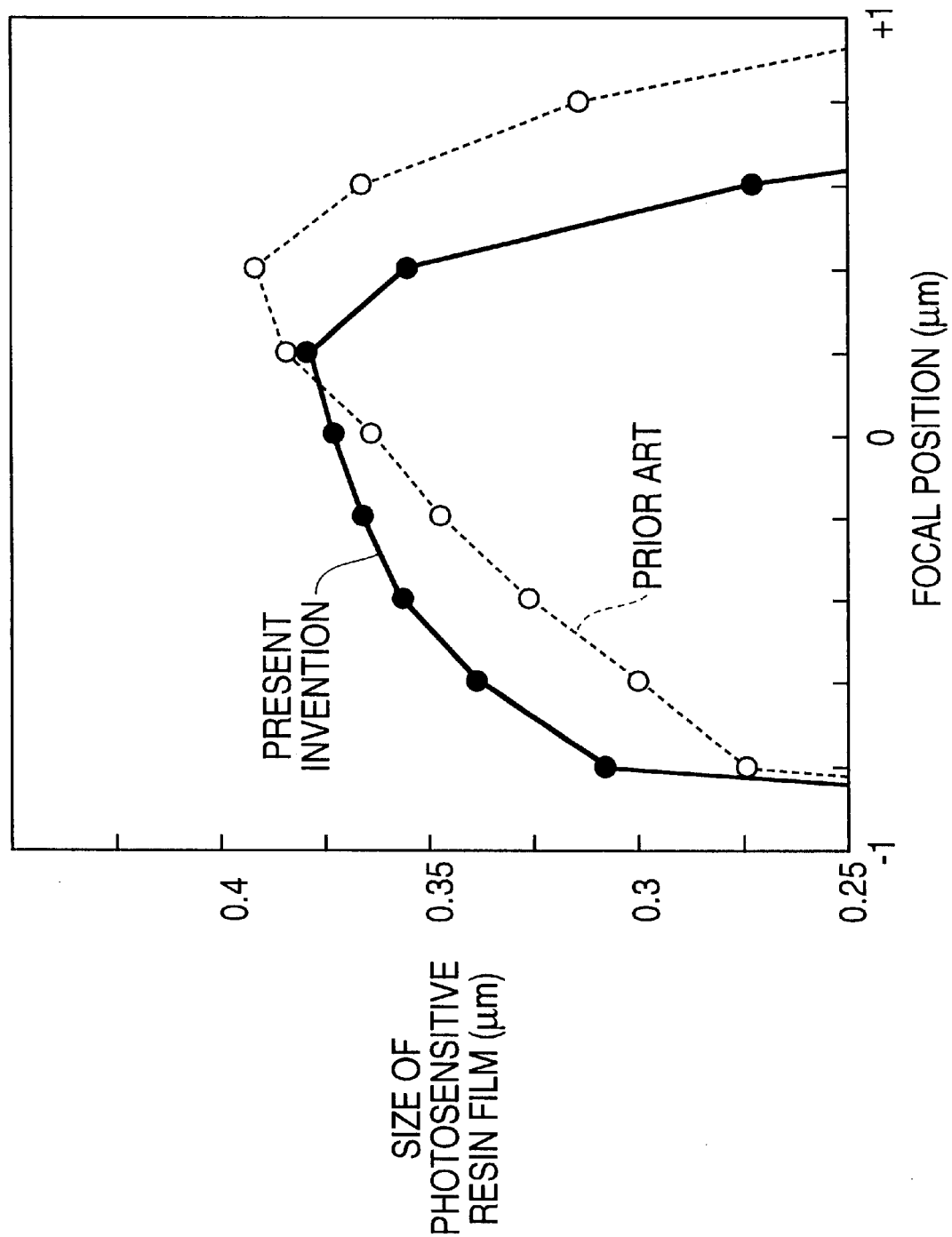

FOCAL POSITION = 0.0μm

FOCAL POSITION = -0.2μm

FOCAL POSITION = -0.6μm

FOCAL POSITION = -0.4μm

FOCAL POSITION = -0.8μm

FOCAL POSITION = +0.2μm

FOCAL POSITION = +0.6μm

FOCAL POSITION = +0.4μm

FOCAL POSITION = +0.8μm

FOCAL POSITION = 0.0μm

FOCAL POSITION = -0.2μm

FOCAL POSITION = -0.6μm

FOCAL POSITION = -0.4μm

FOCAL POSITION = -0.8μm

FOCAL POSITION = +0.2μm

FOCAL POSITION = +0.6μm

FOCAL POSITION = +0.4μm

FOCAL POSITION = +0.8μm

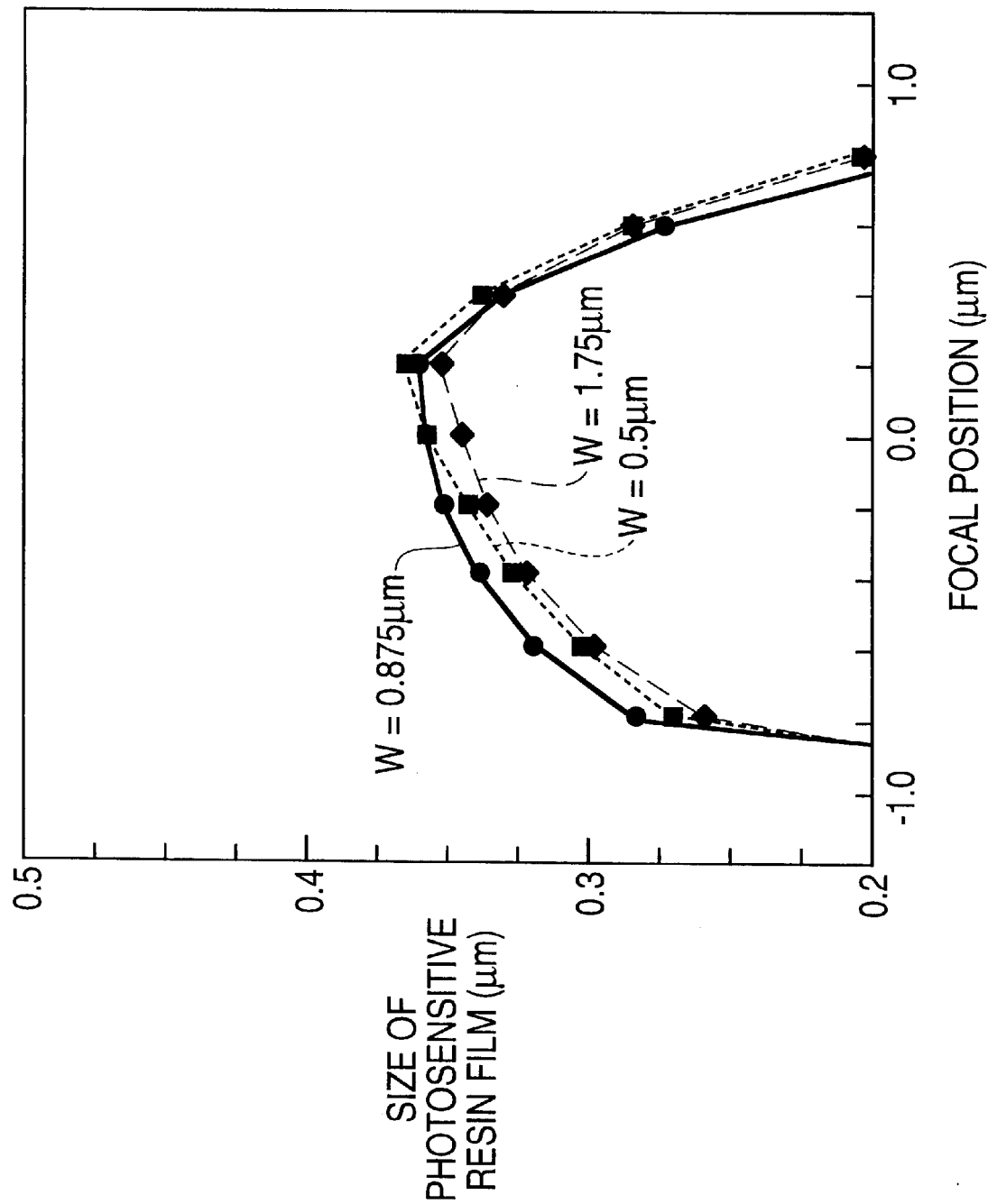

PHASE SHIFTING PHOTOMASK WITH TWO DIFFERENT TRANSPARENT REGIONS

FIELD OF THE INVENTION

This invention relates to a photomask, and more particularly to, a photomask which is used to form a micro pattern in a manufacturing process of semiconductor device.

BACKGROUND OF THE INVENTION

Currently, in a manufacturing process of semiconductor device, a photolithography technique is generally used to form a pattern on a semiconductor substrate. In the photolithography technique, a predetermined pattern can be formed on photosensitive resin film by using a photomask pattern through a demagnifying projection aligner. Herein, 'photomask' means an original mask for exposure on which a pattern of transparent region and masking region is formed, and, though it is called 'reticle' especially except when a demagnification ratio is 1:1, hereinafter, these are commonly referred to as 'photomask'.

Conventional photolithography techniques are directed to the development of an aligner, in particular, a projection lens with a high N.A. (numerical aperture) and exposure light with a shorter wavelength $\lambda$ to form a finer pattern on a semiconductor device. Here, N.A. corresponds to how much divergent light a lens can collect. In other words, the greater N.A. of the lens is, the more the divergent light can be collected, i.e., the more the lens performance can be improved. Moreover, the greater N.A. of the lens is or the shorter wavelength $\lambda$ the exposure light has, the higher the threshold resolution of photosensitive resin film can be improved, thereby providing a finer pattern mask which is used as an etching mask for the fabrication of a semiconductor device.

As described above, by realizing such high N.A. of projection lens and a short wavelength of exposure light, a high resolution can be provided and therefore a fine pattern may be theoretically obtained. However, due to the high N.A. and short wavelength, a focal depth, which means a range that allows a variation of focal position, has been decreased. Therefore, slight movement of focal position may cause a failure in forming a predetermined pattern on photosensitive resin film. Namely, the decreased focal depth makes the formation of a finer pattern difficult.

SUMMARY OF THE INVENTION

Accordingly, it is an object of the invention to provide a photomask which gives an improved focal depth.

According to the invention, a photomask, comprises:

a transparent substrate; and masking film which is selectively formed on the transparent substrate to provide a predetermined pattern composed of a transparent region and a masking region;

wherein the transparent region comprises a first transparent region which is formed adjacent to the masking region and extends like a belt along the masking region and a second transparent region which lies sandwiching the first transparent region with the masking region, whereby a phase of exposure light through the first transparent region is advanced prior to that through the second transparent region.

BRIEF DESCRIPTION OF THE DRAWINGS

The invention will be explained in more detail in conjunction with the appended drawings, wherein:

FIG. 2 shows focus characteristics of the photomask of the first embodiment and a conventional photomask, FIG. 8 shows focus characteristics when a width of a first transparent region of the photomask of the second embodiment is varied.

DESCRIPTION OF THE PREFERRED EMBODIMENTS

Figure 1A:
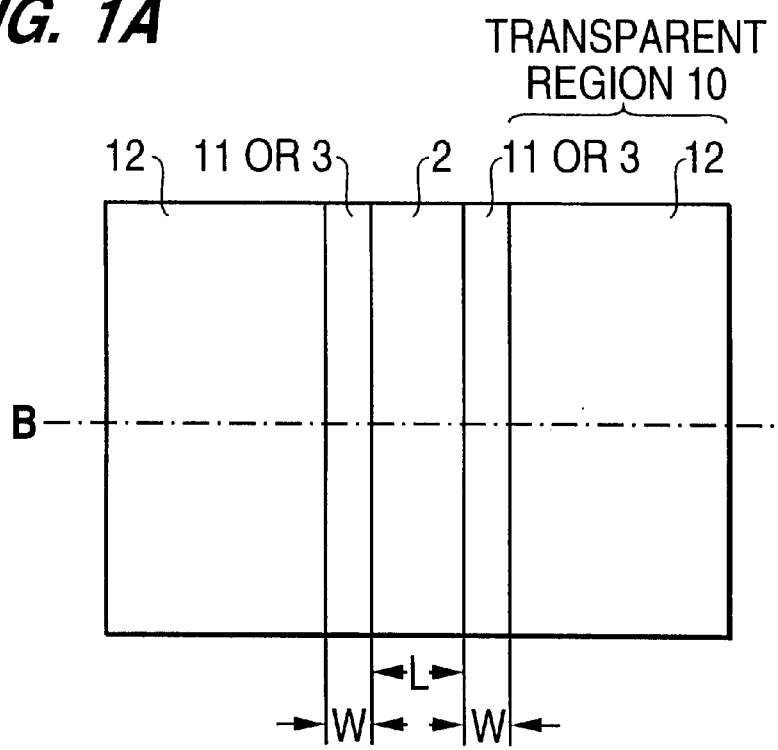
FIG. 1A is a plan view showing a photomask in a first preferred embodiment of the invention.
Figure 1B:
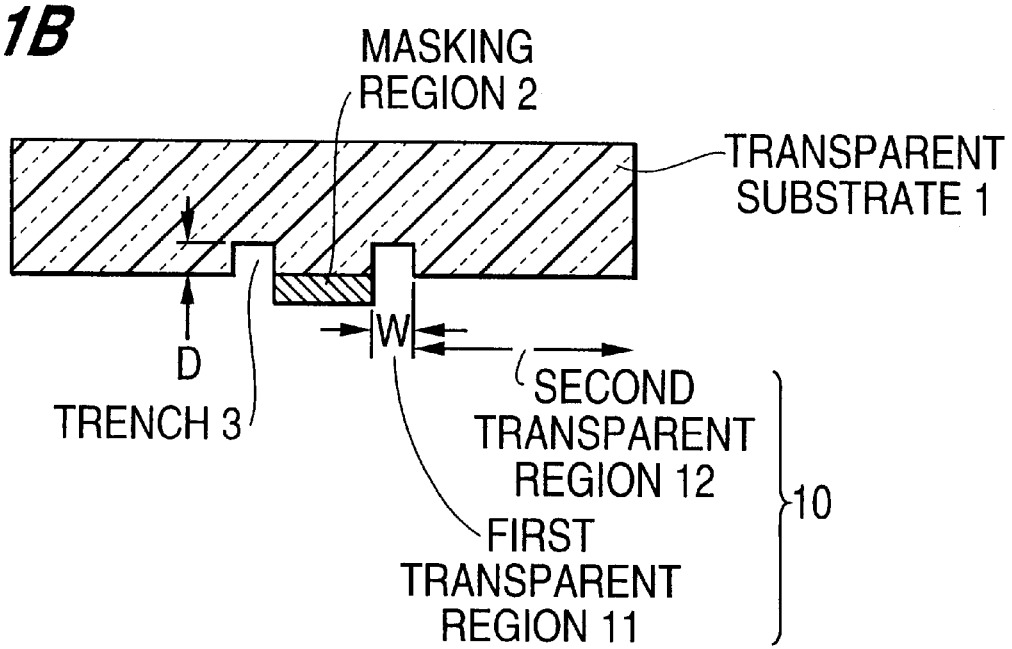
FIG. 1B is a longitudinal sectional view cut along the line B—B in FIG. 1A.
Figure 3A:
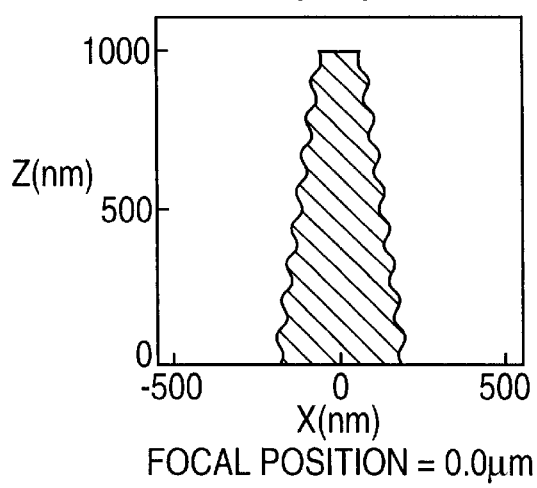
FIGS. 3A to 3E show cross sections of photosensitive resin film patterns formed by using the photomask of the first embodiment.
Figure 3B:
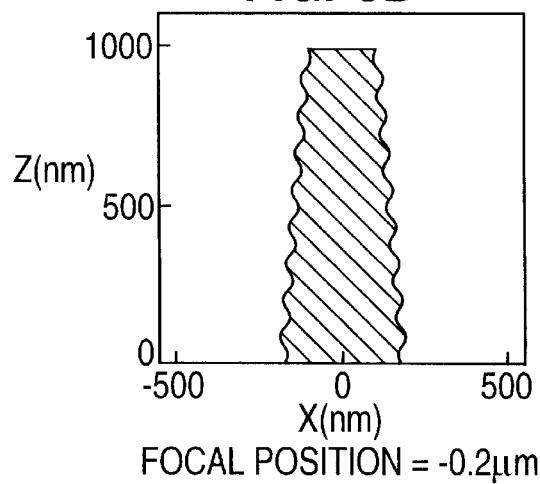
Figure 3D:
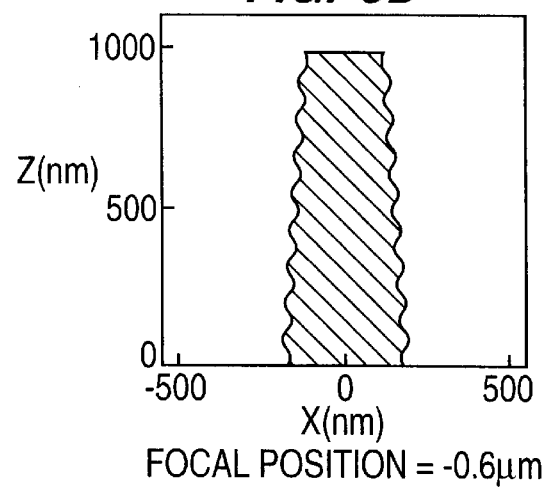
Figure 3C:
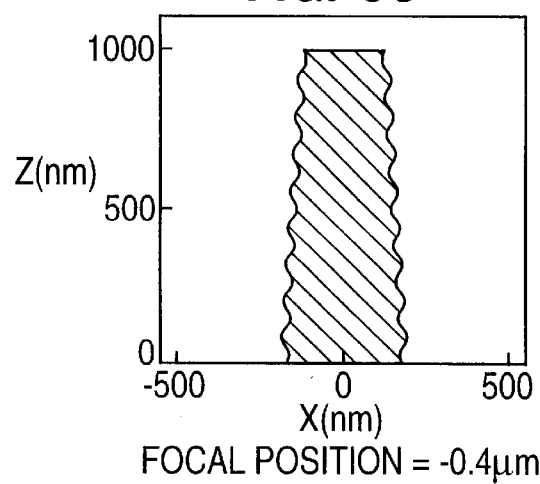
Figure 3E:
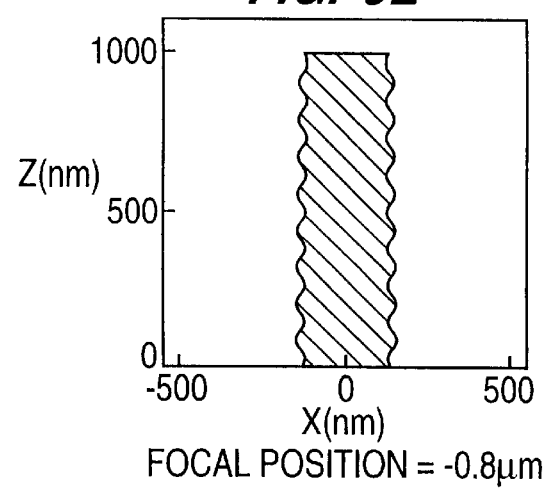
Figure 4A:
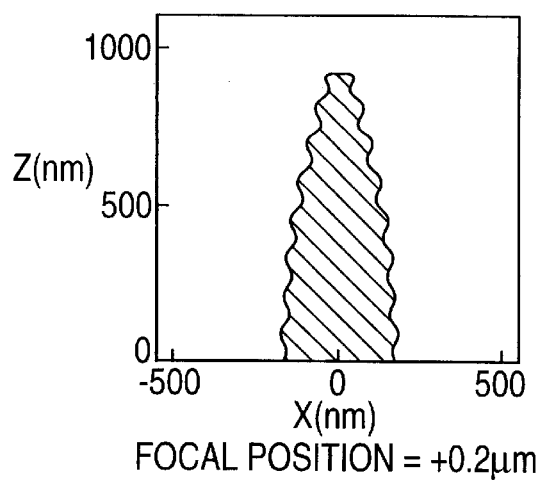
FIGS. 4A to 4D show cross sections of photosensitive resin film patterns formed by using the photomask of the first embodiment.
Figure 4C:
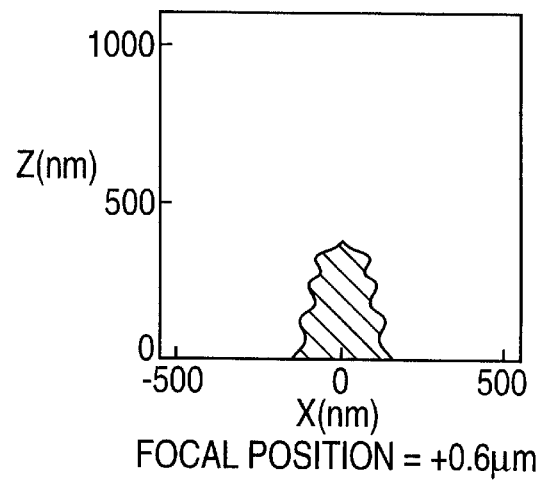
Figure 4B:
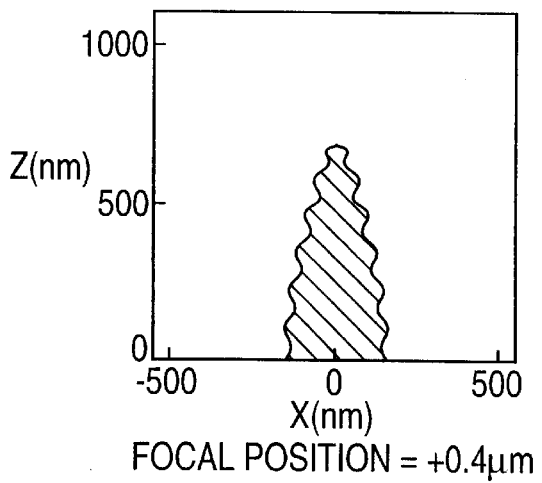
Figure 4D:
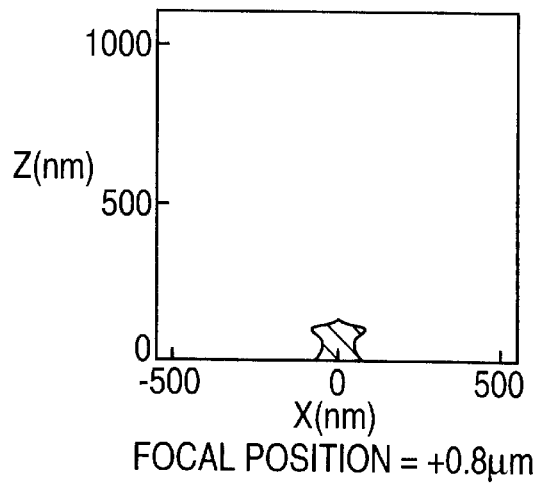
Figure 5A:
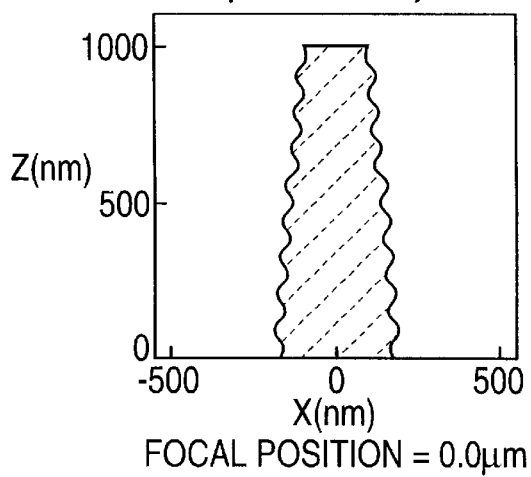
FIGS. 5A to 5E show cross sections of photosensitive resin film patterns formed by using a conventional photomask.
Figure 5B:
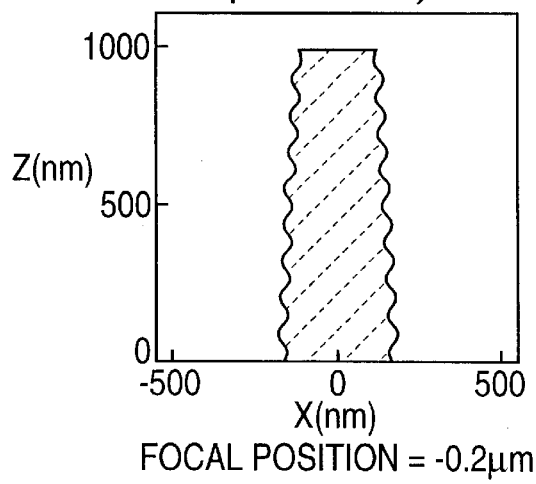
Figure 5D:
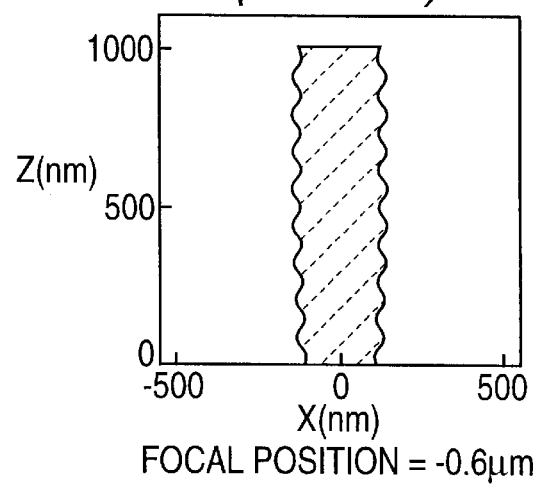
Figure 5C:
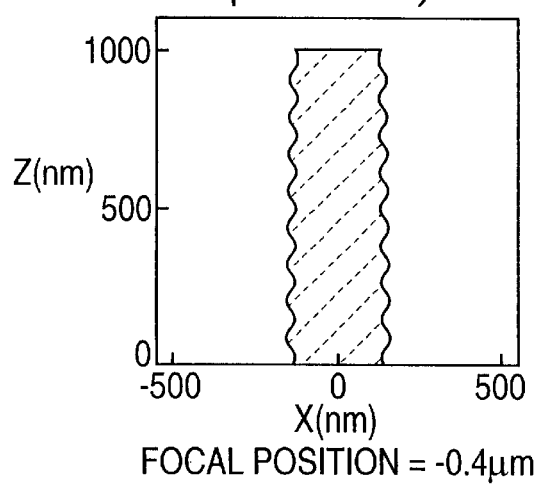
Figure 5E:
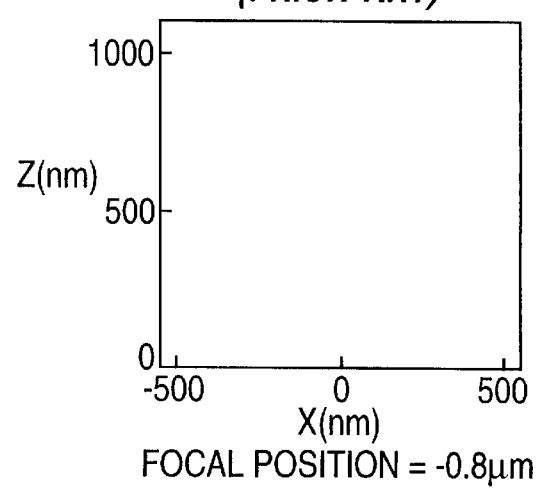
Figure 6A:
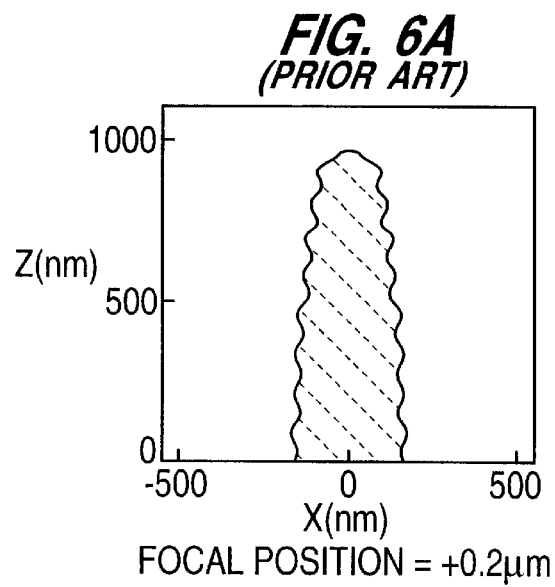
FIGS. 6A to 6D show cross sections of photosensitive resin film patterns formed by using the conventional photomask.
Figure 6C:
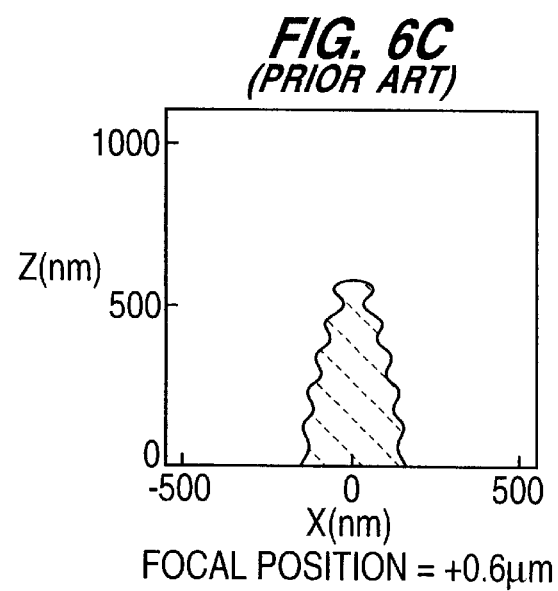
Figure 6B:
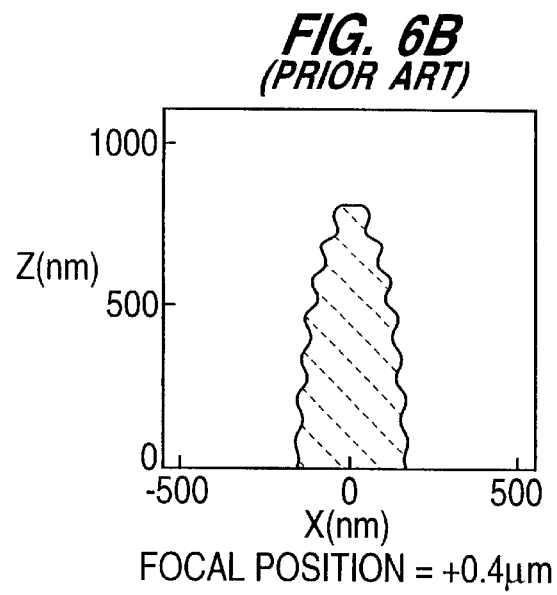
Figure 6D:
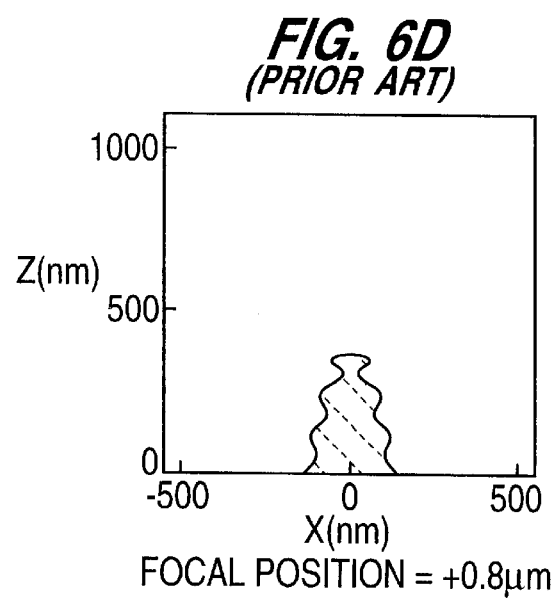

A photomask in the first preferred embodiment of the invention will be explained in FIGS. 1A and 1B, wherein FIG. 1A is a plan view thereof and FIG. 1B is a longitudinal sectional view cut along the line B—B in FIG. 1A, Besides, herein used is an i-line demagnifying projection aligner with a demagnification ratio of 5 times (mask pattern size:image-forming surface size=5:1), N.A. (numerical aperture)=0.6 and $\sigma$ (coherence factor)=0.6. A mask isolated pattern with a width L of 1.75 $\mu$m is provided to form a 0.35 $\mu$m(at image-forming surface) isolated line pattern on photosensitive resin film. Herein, 'isolated pattern' means than it is not a periodical pattern such as 'line and space' and means that, for example, when a mask pattern is composed of a masking film pattern with a width L, another masking film pattern does not exist within a range of 2×L from the masking film pattern. The other conditions fur simulations described later are that photosensitive resin film has a thickness of 1.0 $\mu$m and the upper surface of a semiconductor substrate is of silicon(Si).

The photomask in the first embodiment has a predetermined pattern composed of a transparent region 10 and a masking region 2, which are provided by selectively forming a masking film 2 such as chrome film on the flat main surface of a transparent substrate 1 of quartz glass. The transparent region 10 is a region with a transmission factor of 90% or more to exposure light and the masking region 2 is a region with a transmission factor of about 0% to exposure light. Furthermore, in the first embodiment, the transparent region 10 is composed of a first transparent region 11 which contacts the masking region 2 and extends like a belt with, a width W along the masking region 2 and a second transparent region 12 which lies sandwiching the first transparent region 11 with the masking region 2, whereby a chase of exposure light through the first transparent region 11 is advanced prior to that through the second transparent region 12.

The masking film 2 which forms the isolated line pattern 2 with a width L of 1.75 $\mu$m is first formed on the transparent substrate 1, and the first transparent region 11 is then formed by etching the flat main surface of the transparent substrate 1 by a width W of 0.875 μm from the isolated line pattern 2 to provide a trench 3 with a depth D of 44 nm. Thus, since the air in the trench 3 has a refractive index of 1 whereas the refractive index n of the transparent substrate 1 of quartz glass is 1.46 to the i-line exposure light with a wavelength A=365 nm, the level difference at the trench 3 serves such that the phase of the light adjacent to the isolated line pattern 2, i.e., the light passing through the first transparent region 11 is brought prior to that of the light passing the second transparent region 12, i.e., the quartz transparent substrate 1 which is not etched. Namely, as compared with the phase of the light passing through the second transparent region 12, the light phase in the first transparent region 11 adjacent to the isolated line pattern 2 is advanced by +20 degree, i.e., a phase difference of 20 degree being occurred.

FIG. 2 shows a simulation as to focus characteristics, which are relationships between focal positions and pattern sizes of photosensitive resin film, of the photomask in the first embodiment shown in FIG. 1A, whose data are indicated by ● in FIG. 2. Also, comparative data of a conventional photomask, which are indicated by O, are shown in FIG. 2. Herein, 'conventional photomask' means a photomask in which a like isolated line pattern is formed on the flat main surface of a quartz transparent substrate without forming the trench 3 shown in FIG. 1B, i.e., without forming the above phase difference in the transparent region, Besides, the sign '+' as to focal position stands for a direction that a semiconductor substrate approaches a projection lens and the sign '−' stands for a direction what the semiconductor substrate is pulled away from the projection lens. In this simulation, a focal position of 0 μm means that the focus lies at the middle of the thickness of photosensitive resin film.

As shown in FIG. 2, in the photomask of the invention, the focus characteristics of isolated line pattern on '−' side of focal position, though those of the conventional photomask have a large inclination, can he significantly flattened, thereby precisely controlling the pattern size. Namely, even if there occurs some movement of focal position, a photosensitive resin film pattern nearly with an intended size can be formed.

Meanwhile, it is understood that the large inclination of the focus characteristics of the conventional photomask is mainly because the photosensitive resin film has a finite thickness (generally 1 to 3 μm). At the image-forming surface, an optical intensity is varied symmetrically depending on the sign '±' of a focal position. Therefore, if the thickness of photosensitive resin film is zero, the focus characteristics could be also symmetrical depending on the sign '±' of a focal position. However, since the photosensitive resin film has a thickness and therefore there occurs a difference of focal position in the film thickness, the state of exposure in the photosensitive resin film will be varied when the focal position is shifted in the direction of + or −. Actually, when the thickness of photosensitive film is varied, the Inclination of the focus characteristics is also varied, i.e., the inclination is decreased with a decrease in the film thickness and it is increased with an increase in the film thickness.

On the other hand, the reason why the focus characteristics can be corrected by the photomask of the invention can be explained by a phenomenon that focus characteristics in a general phase-shifting mask ara inclined when a phase error occurs. Especially in a Shibuya-Revenson type phase-shifting mask, it is known that the focus characteristics is inclined depending on the sign ± and degree of a phase error when the phase error occurs, and it is therefore required that the phase error is suppressed within several % of a preset value. In this invention, such phase error that does not occur except in the phase-shifting mask can be intentionally generated by altering the transparent region, and the focus characteristics can be corrected by using a controlled phase error.

FIGS. 3A to 3E and 4A to 4D show simulated cross sections of photosensitive resin film patterns which are obtained by exposing the photosensitive resin films through a demagnifying projection using a photomask of the invention at different focal positions and then developing them, where the cross sections of photosensitive resin film to be formed are indicated by areas hatched with full lines slanting to the right.

Also, FIGS. 5A to 5E and 6A to 6D show simulated cross sections of photosensitive resin film patterns which are obtained by exposing the photosensitive resin films through a demagnifying projection using a conventional photomask at different focal positions and then developing them, where the cross sections of photosensitive resin film to be formed are indicated by areas hatched with dotted lines slanting to the left.

In FIGS. 3A to 6D, the lateral axis gives a position X(nm) on a semiconductor substrate and the longitudinal axis gives a position Z(nm) in the direction of thickness of photosensitive resin film. Similarly to FIG. 2, the sign '+' as to focal position stands for a direction that a semiconductor substrate approaches a projection lens and the sign '−' stands for a direction that the semiconductor substrate is pulled away from the projection lens. In this simulation, a focal position of 0.0 μm means that the focus lies at the middle of the thickness of photosensitive resin film.

In both the cases of the conventional photomask and the photomask of the invention, as shown in FIGS. 5A to 6D and 4A to 4D, the thickness(Z) of photosensitive resin film obtained is decreased with quantity of movement in a focal position more than +0.2 μm and the angle or the side wall is so decreased below 90 degree as to give a cross section with a sharpened top surface. Therefore, such photosensitive resin film patterns are not suitable for using as an etching mask for the next etching process (for example, a process that conductive film under the photosensitive resin film is etched to form a wiring layer). If they are used, the variation of size in the etching will be increased.

On the other hand, if the size variation of up to 10% as to photosensitive resin film pattern is allowed, the threshold values on the '−' side can be defined from the results shown in FIGS. 5A to 5E, 3A to 3E and 2. Namely, the photomask in the first embodiment is provided with a focal depth of 0.6 μm which is defined by the allowed focal positions of −0.6 μm to 0.0 μm, while the conventional photomask is provided with a focal depth of 0.4 μm, which is defined by the allowed focal positions of—0.4 μm to 0.0 μm. As a result, in the first embodiment, the focal depth can be lengthened about 50%.

Meanwhile, in the current manufacturing technique, the precision of a trench depth or width when the trench is formed on a transparent mask substrate by etching lies within 2 to 3%. However, even if the trench depth or width is varied several %, the focus characteristics obtained will not so change. Actually, in the first embodiment, the phase difference of 20 degree is kept almost constant to such variation. Namely, the photomask of the invention can be provided with a large tolerance in manufacturing the mask and therefore can be easily manufactured with an intended focus characteristic.

A photomask in this second preferred embodiment of the invention will be explained in FIG. 7, wherein like parts are indicated by like reference numerals as used in FIG. 1 and explanations thereof are omitted.

In the second embodiment, to advance the light phase in the first transparent region 11 adjacent to the isolated line pattern 2 as compared with the phase of the light passing through the second transparent region 12, for example, by +20 degree, the second transparent region 12 employs transparent film 4 of silicon dioxide etc. with a thickness of T, whereby the same effect as the photomask in the first embodiment can be obtained.

Figure 7:
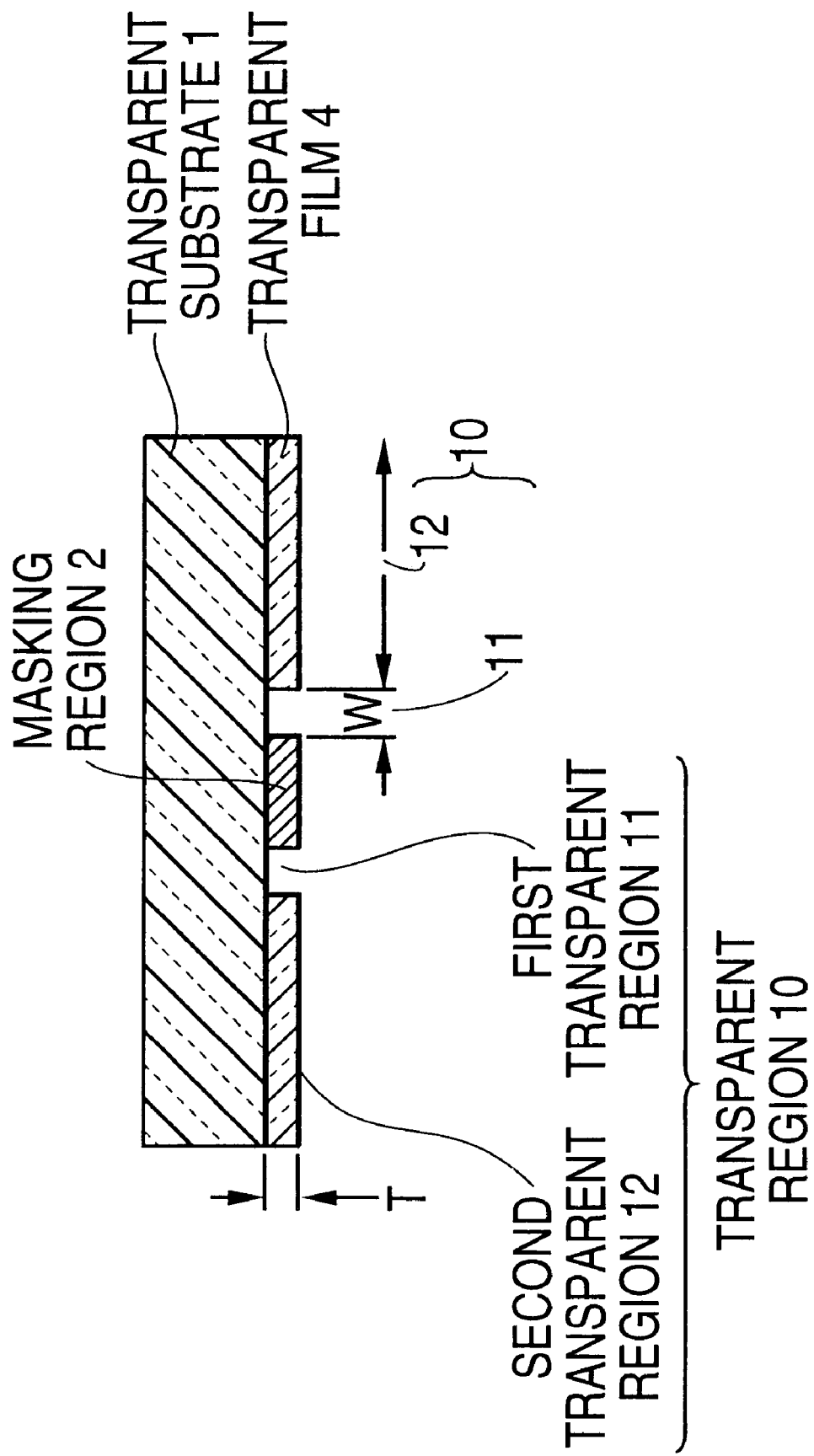
FIG. 7 is a longitudinal sectional view showing a photomask in a second preferred embodiment of the invention.

As shown in FIG. 7, the transparent film 4 is selectively formed on the flat main surface of the quartz transparent substrate 1, where the first transparent region 11 with a width W is defined by an area where the masking film 2 and the transparent film 4 are not formed on the transparent substrate 1 and the second transparent region 12 is defined by the area where the transparent film 4 is formed on the transparent substrate 1.

In the second embodiment, the effect of correcting the focus characteristics is varied by a phase-shifting region adjacent to the isolated line pattern, i.e., a phase difference (a depth D of the concavity or a thickness T of the transparent film 4) of the first transparent region 11 to the second transparent region 12, and by a width W of the first transparent region 11.

First, the effect of the width W of the first transparent region 11 will be explained below. FIG. 8 shows a simulation as to focus characteristics when the width W of the first transparent region 11 of the photomask in the second embodiment is varied. In FIG. 8, the focus characteristic in a width W=0.875 μm on the photomask (equivalent to 0.175 μm on the image-forming surface, i.e., on the photosensitive resin film) is indicated by ●, the focus characteristic in a width W=0.5 μm (equivalent to 0.1 μm on the image-forming surface) is indicated by ■ and the focus characteristic in a width W=175 μm (equivalent to 0.35 μm on the image-forming surface) is indicated by ♦.

In the widths W=0.5 μm and W=1.75 μm on the photomask, the focus characteristics can be improved better than that of the conventional photomask, but the inclinations of the focus characteristics are not well corrected as compared with that of the width W=0.875 μm on the photomask.

Since, in the present invention, the inclination of focus characteristic is corrected by intentionally generating a phase error nearby the edges of the isolated line pattern, the correcting effect is, of course, reduced when this phase-shifting region, i.e., the width of the first transparent region is short. On the other hand, when the width of the first transparent region is too long, the correcting effect is also reduced since the intentional phase error will not occur nearby the edges. Thus, there exists a proper range of width in the phase error region.

From the simulation result under various exposure conditions in the second embodiment, the practical lower and upper limits of the width W are, as shown in FIG. 8, preferably 0.5 μm and 1.75 μm, respectively.

In the exposure conditions of the second embodiment, N.A. of projection lens is 0.6, i-line exposure light is used and the wavelength λ is 365 nm (=0.365 μm). Normalizing the widths, W=0.5 μm and W=1.75 μm obtained in this exposure conditions by using λ(μ/m)/N.A. to adapt these data to the other exposure conditions, the lower limit $W_L$(μm) of the width W is given by $W_L=0.82\times(\lambda/N.A.)$ and the upper limit $W_O$ is given by $W_{ij}=2.88\times(\lambda/N.A.)$.

Next, the effect of the phase difference will be explained below. Though the focus characteristic is more varied with an increase in phase error (a difference of the phase difference from 0° and 180°), when the phase error is too big, the focus characteristic is highly varied by a slight variation of the width W of the first transparent region that corresponds to the phase error region, thereby reducing a margin for mask manufacture. On the other hand, currently-suggested various lighting methods with different coherent factors(σ) has been tested. As a result, in the exposure conditions of the existing demagnifying projection aligners that are generally used, it is preferable that a phase of exposure light through the first transparent region is advanced 3 to 30 degree prior to that through the second transparent region. To get such phase difference, a depth D of the trench 3 in FIG. 1 and a thickness L of the transparent film 4 in FIG. 7 are to be determined.

Now, if a refractive index n of the quartz transparent substrate or transparent film, a wavelength λ(nm) of exposure light and a phase difference Δθ(degree) are provided, the depth D(nm) of the trench 3 or the thickness T(nm) of the transparent film 4 is given by:

$$\lambda \div \{2\times(n-1)\} \times \{\Delta\theta \div 180\}.$$

For example, if n=1.46 and λ=365 nm are provided as in the first embodiment shown in FIG. 1, the lower limit of depth $D_1$ of the trench, which is required for obtaining the phase difference of 3", is 6.6 nm and the upper limit of depth $D_1$ of the trench, which is required for obtaining the phase difference of 30", is 66.1 nm.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A photomask, comprising:
   a transparent substrate; and
   a masking film which is selectively formed on said transparent substrate to provide a predetermined pattern composed of a transparent region and a masking region;
   wherein said transparent region comprises a first transparent region and a second transparent region;
   wherein said first transparent region is formed between said masking region and said second transparent region; and
   wherein a phase of light exposed through said first transparent region is phase shifted 3 to 30 degrees with respect to light exposed through said second transparent region.

2. A photomask, according to claim 1, wherein:
   a width W(μm) of said first transparent region in the direction of extending from said masking region to said second transparent region is in the following range:

$$0.82\times(\lambda/N.A.) \leq W \leq 2.88\times(\lambda/N.A.)$$

where λ(μm) represents a wavelength of exposure light and N.A. represents a numerical aperture of a projection lens used in a same exposure process as said photomask.

3. A photomask, according to claim 2, wherein:
   said first transparent region is provided as a trench which is formed by etching a flat main surface of said transparent substrate and said second transparent region is provided by an area of said transparent substrate where said trench is not formed.

4. A photomask, according to claim 2, wherein:

said second transparent region is provided by selectively forming a transparent film on a flat main surface of said transparent substrate and said first transparent region is provided as an area where said transparent film is not formed.

5. A photomask, according to claim 1, wherein:

said first transparent region is provided as a trench which is formed by etching a flat main surface of said transparent substrate and said second transparent region is provided by an area of said transparent substrate where said trench is not formed.

6. A photomask, according to claim 5, wherein the depth of the trench, D, is given by the following relationship $$D=[\lambda/\{2\times(n-1)\}]\times(\Delta\Theta/180)$$

wherein $\lambda$ represents a wavelength of the light exposed through said transparent substrate, n represents a refractive index of said transparent substrate, and $\Delta\Theta$ represents a phase difference in degrees between light exposed through said first transparent region and said second transparent region.

7. A photomask, according to claim 1, wherein:

said second transparent region is provided by selectively forming a transparent film on a flat main surface of said transparent substrate and said first transparent region is provided as an area where said transparent film is not formed.

8. A photomask, according to claim 7, wherein the thickness of said transparent film, T, is given by the following relationship $$T=[\lambda/\{2\times(n-1)\}]\times(\Delta\Theta/180)$$

wherein $\lambda$ represents a wavelength of the light exposed through said transparent substrate, n represents a refractive index of said transparent substrate, and $\Delta\Theta$ represents a phase difference in degrees between light exposed through said first transparent region and said second transparent region.

* * * * *